US008288943B2

(12) United States Patent
Ansems et al.

(10) Patent No.: US 8,288,943 B2
(45) Date of Patent: Oct. 16, 2012

(54) ILLUMINATION DEVICE WITH LED AND A TRANSMISSIVE SUPPORT COMPRISING A LUMINESCENT MATERIAL (75) Inventors: Johannes Petrus Maria Ansems, Eindhoven (NL); Lars Rene Christian Waumans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 53 days.

(21) Appl. No.: 12/935,935

(22) PCT Filed: Apr. 1, 2009

(86) PCT No.: PCT/IB2009/051365
§ 371 (c)(1),
(2), (4) Date: Oct. 1, 2010

(87) PCT Pub. No.: WO2009/125314
PCT Pub. Date: Oct. 15, 2009

(65) Prior Publication Data
US 2011/0025192 A1 Feb. 3, 2011

(30) Foreign Application Priority Data
Apr. 8, 2008 (EP) .................................... 08154198

(51) Int. Cl.
*H01J 1/62* (2006.01)
(52) U.S. Cl. .......... 313/512; 313/502; 313/508; 445/24; 362/84
(58) Field of Classification Search .......... 313/498–512; 257/40, 296, 98, 99, 100, 80, 79
See application file for complete search history.

(56) References Cited

U.S. PATENT DOCUMENTS

| | | | |
|---|---|---|---|
| 6,490,104 B1 * | 12/2002 | Gleckman et al. | 359/819 |
| 6,862,118 B2 | 3/2005 | Ishimoto et al. | |
| 7,091,661 B2 * | 8/2006 | Ouderkirk et al. | 313/512 |
| 7,361,938 B2 * | 4/2008 | Mueller et al. | 257/94 |
| 7,728,341 B2 * | 6/2010 | Mazzochette et al. | 257/98 |
| 7,800,287 B2 * | 9/2010 | Zheng et al. | 313/112 |
| 8,008,850 B2 * | 8/2011 | Su et al. | 313/498 |
| 8,089,207 B2 * | 1/2012 | Ramer et al. | 313/501 |
| 2005/0269582 A1 | 12/2005 | Mueller et al. | |
| 2006/0202105 A1 | 9/2006 | Krames et al. | |
| 2007/0075306 A1 | 4/2007 | Hayashi et al. | |
| 2007/0102693 A1 | 5/2007 | Nagai | |
| 2007/0126017 A1 | 6/2007 | Krames et al. | |
| 2007/0263298 A1 | 11/2007 | El-Ghoroury et al. | |
| 2008/0074029 A1 | 3/2008 | Suehiro | |
| 2010/0254127 A1 * | 10/2010 | Yang | 362/231 |
| 2010/0328925 A1 * | 12/2010 | Hoelen et al. | 362/84 |
| 2010/0328926 A1 * | 12/2010 | Hoelen et al. | 362/84 |

FOREIGN PATENT DOCUMENTS

JP 2007234637 9/2007
(Continued)

*Primary Examiner* — Tracie Y Green
(74) *Attorney, Agent, or Firm* — John F. Salazar; Mark L. Beloborodov (57) ABSTRACT

The invention provides an illumination device (10) with a light emitting diode (20), a transmissive support (50) comprising a luminescent material (51), and a translucent exit window (60). The ratio of the diffuser cavity cross section (212) and LED cavity cross section (211) is larger than (1). With the proposed illumination device (10), the lamp may in particular look white when it is in the off-state and illuminated with white light. Other advantages are that an intrinsically efficient system may be provided and that a warm white option may be provided.

11 Claims, 2 Drawing Sheets

FOREIGN PATENT DOCUMENTS

| | | |
|---|---|---|
| WO | 2006059535 A2 | 6/2006 |
| WO | 2006097868 A2 | 9/2006 |
| WO | 2006114726 A2 | 11/2006 |
| WO | 2007080555 A1 | 7/2007 |

\* cited by examiner

ILLUMINATION DEVICE WITH LED AND A TRANSMISSIVE SUPPORT COMPRISING A LUMINESCENT MATERIAL

FIELD OF THE INVENTION

The invention relates to an illumination device with a transmissive support comprising a luminescent material.

BACKGROUND OF THE INVENTION

Illumination devices comprising a transmissive support with a luminescent material are known in the art. Transmissive ceramic layers or luminescent ceramics, and their method of preparation, are known in the art. It is for instance referred to US2005/0269582, US2006/0202105), WO2006/097868, WO2007/080555, US2007/0126017 and to WO2006/114726.

US2005/0269582, for instance, discloses a semiconductor light emitting device combined with a ceramic layer which is disposed in a path of light emitted by the light emitting layer. The ceramic layer is composed of or includes a wavelength-converting material such as a luminescent material.

SUMMARY OF THE INVENTION

A disadvantage of the prior art systems may be that applying a luminescent material layer as exit window or as material visible to a viewer may result in a color of the exit window, especially a yellow-orange color, when the system is in the off-state. This is the case when the luminescent material-coated window can be viewed directly, e.g. when this window is the light emitting exit window. Such a colored appearance of a lamp (or luminaire) is often unwanted; a neutral appearance is in general preferred.

Hence, it is an aspect of the invention to provide an alternative illumination device, which preferably further obviates one or more of the above-described drawbacks. It is especially an aspect of the invention to provide an illumination device that has a substantially non-colored appearance in the off state, like in many conventional bulbs with frosted glass.

It is a further aspect of the invention to provide a device with an improved efficiency.

In a first aspect, the invention provides an illumination device comprising:
a. a light emitting diode (LED) arranged to emit LED emission;
b. a transmissive support comprising a luminescent material, wherein the luminescent material is arranged to absorb at least part of the LED emission and emit luminescent material emission, wherein the LED and the luminescent material are arranged to generate light of a predetermined color;
c. a translucent exit window arranged to transmit at least part of the light;
d. a LED cavity and a diffuser cavity, wherein the LED cavity has a LED cavity side wall and a LED cavity cross section, and the diffuser cavity has a diffuser cavity side wall and a diffuser cavity cross section,
wherein, relative to the LED,
the transmissive support is downstream of the LED and upstream of the translucent exit window;
the LED cavity is upstream of the transmissive support and downstream of the LED;
the diffuser cavity is downstream of the transmissive support and upstream of the translucent exit window; and
the ratio of the diffuser cavity cross section and LED cavity cross section is larger than approximately 1.

In this way, advantageously, an alternative illumination device is provided. Further, advantageously, the device efficiency seems to be higher than for devices that have a diffuser cavity cross section/LED cavity cross section ratio of 1.

In a specific embodiment, the ratio of the diffuser cavity cross section and LED cavity cross section is in the range of about 1.01 to 2, such as in the range of about 1.01 to 1.5, especially 1.01 to 1.2. With the diffuser cavity cross section/LED cavity cross section ratio as defined herein, the best device efficiency may be obtained, while with a ratio of about 1, the efficiency may be lower. With the higher efficiency, energy may be saved. Further, fewer LEDs may be applied in the device and/or fewer devices may be applied, while the light output of the device(s) remains the same.

In an embodiment, the LED cavity side wall comprises a LED cavity reflector arranged to reflect LED emission and optionally luminescent material emission back into the LED cavity, wherein the LED cavity reflector has a reflectivity under perpendicular irradiation of visible light of at least about 95%, especially at least about 98% in at least the blue region. The application of a (relatively thick) LED cavity reflector is a relatively easy way to reduce the cavity cross section of the LED cavity relative to the diffuser cavity cross section. Since the walls of the diffuser cavity cross section may also comprise a reflector (diffuser cavity reflector), the value larger than approximately 1 for the ratio of the diffuser cavity cross section and LED cavity cross section may for instance be obtained by applying a LED cavity reflector that is thicker than the diffuser cavity reflector. Other options to obtain the desired ratio are described below.

In a specific embodiment, the LED cavity reflector comprises a diffuse reflector, and more especially is a diffuse reflector. In an embodiment, the LED cavity reflector comprises one or more materials selected from the group consisting of Teflon, MCPET (micro-foamed polyethylene terephthalate), and particulate $TiO_2$ in a matrix material. In another embodiment, the LED cavity reflector comprises a specular reflector, and more especially is a specular reflector. In yet another embodiment, the LED cavity reflector comprises a diffuse and specular reflector. For instance, the reflector may be partially specular and partially diffuse.

In a specific embodiment, the transmissive support has a transmissive support thickness in the range of about 0.1 to 5 mm, especially about 0.1 to 2 mm, such as about 0.2 to 2 mm, even more especially about 0.4 to 2 mm.

The LED cavity reflector may, in an embodiment, have a reflector thickness in the range of about 0.2 to 5 mm, especially about 0.3 to 4 mm. Especially, the thickness ratio of the reflector thickness and the transmissive support thickness is in the range of about 0.5 to 10, especially in the range of about 1 to 6, even more especially in the range of about 1.1 to 5. In this way, the best results in respect of illumination device efficiency may be obtained.

In an embodiment, the diffuser cavity and the LED cavity may independently have a form selected from the group consisting of a cylinder, a cube, a cuboid (also called a rectangular prism), a pentagonal prism, and a hexagonal prism (i.e. a hexagonal shape). In a specific embodiment, the LED cavity and/or the diffuser cavity have the form of a cylinder. In yet another specific embodiment the LED cavity and/or the diffuser cavity have a hexagonal shape. Especially in the case of hexagonal shapes/forms, the LED cavity reflector may comprise a specular reflector or a combination of a diffuse and specular reflector.

Further, in an embodiment, the diffuser cavity and the LED cavity may independently have the shape selected from the group consisting of an apex truncated cone, an apex truncated paraboloid of revolution, and an apex truncated pyramid with a polygonal basis, wherein the polygonal basis has 3 or more edges (such as a quadrilateral frustum (apex-truncated square pyramid), an apex-truncated pentagonal pyramid, an apex-truncated hexagonal pyramid). Herein, the term apex-truncated relates to shapes where the diffuser cavity or the LED cavity have such geometrical shapes, wherein the apex is upstream and the base of the geometrical shape is downstream. In a specific embodiment, the LED cavity and the diffuser cavity independently have a shape selected from the group consisting of an apex truncated cone and an apex truncated paraboloid of revolution. In another specific embodiment, the LED cavity and the diffuser cavity independently have the shape of an apex-truncated hexagonal pyramid. Hence, the LED cavity walls and the diffuser cavity walls may independently be straight or tapered.

Especially, the LED cavity and the diffuser cavity have the same shape (yet they may have different dimensions). Especially, in an embodiment, the LED cavity and the diffuser cavity have the form of a cylinder. In another embodiment, the LED cavity and the diffuser cavity have a hexagonal shape.

With the proposed illumination device, the lamp may in particular look white when it is in the off-state and when it is illuminated with white light. Other advantages, especially relative to systems wherein the luminescent material is provided on the LED, may be that an intrinsically efficient system (less back reflection/reabsorption) may be provided and that a warm white option (without substantial thermal quenching and with a relatively "low" irradiation of the luminescent material) may be provided. Further, the illumination device according to the invention is a relatively simple concept (may be based on blue LEDs only, which has the advantage of relatively easy assembly and driving) and the option of an adjustable color temperature is feasible.

Remote luminescent material in LED-based light sources seems to be very advantageous with respect to system efficacy, in particular for the generation of light with a low color temperature (warm white). Applying a luminescent material coating on a transmissive support or film may result in high system efficacy, because only little light may be reflected back into the LED where it has a rather high chance of being absorbed. Using the luminescent material remote from the LEDs can result in efficacy gains up to about 50% compared to systems with luminescent material in the LED package.

As mentioned above, applying a luminescent material layer at the surface, especially the emitting surface (i.e. downstream surface), of an exit window may result in a rather saturated color point of that surface when the lamp is off and when it is illuminated with white light. The degree of saturation of the appearing color of the exit window can be reduced by applying, according to the invention, the luminescent material coating on (and/or in) a transmissive carrier located in between the LEDs and a diffusive, translucent material exit window of the illumination device.

The translucent exit window acts as the virtual emission window (for the further optical system, where the light may be further manipulated for e.g. beam shaping). With an increasing distance between the luminescent material (layer) and the translucent exit window (indicated as dLW), the saturation of the color of the translucent exit window may be further reduced. Typically, the saturation can be reduced from about 62% to about 50% by separating the luminescent material layer from the translucent exit window with almost zero spacing (dLW) in between, and can be further reduced to less than about 20% by increasing the spacing. Further, spreading the light from the emitting luminescent material layer over a translucent exit window that has a larger upstream surface area (AEW1) than the surface area of the emitting luminescent material layer (i.e. the upstream face area (AS1) of the transmissive support) may also reduce the saturation of the color of the translucent exit window. Typically, with a surface area ratio (AEW1/AS1) of 8, the saturation may be reduced to about 11%, and can be further reduced by a further increase of the surface area ratio.

Some of the measures listed above and hereinbelow may amongst others be based on applying additional scattering or reflection in the system. Surprisingly, however, the system efficiency is almost preserved, while in general the addition of more scattering and of more (partly) reflective surfaces in a system causes a very significant reduction of the system efficiency.

LED and Luminescent Material

In an embodiment, the LED is arranged to emit blue emission and the luminescent material comprises (a) a green luminescent material, arranged to absorb at least part of the blue LED emission and to emit green emission, and (b) a red luminescent material, arranged to absorb at least part of the blue LED emission or at least part of the green emission or both at least part of the blue emission and at least part of the green emission and to emit red emission. In this way, the light of a predetermined color may be white light. Depending upon amongst others LED power, the blue LED emission spectrum, and luminescent material amounts, white light of different color temperatures may be composed.

In another embodiment, the LED is arranged to emit blue emission and the luminescent material comprises (a) a yellow luminescent material, arranged to absorb at least part of the blue emission and to emit yellow emission, and optionally (b) one or more other luminescent materials, arranged to absorb at least part of the blue LED emission or at least part of the yellow emission or both at least part of the blue emission and at least part of the yellow emission, and to emit at an emission wavelength different from the yellow emission. Also in this way, the light of a predetermined color may be white light. Depending upon amongst others the blue LED emission spectrum, LED power and luminescent material amounts, white light of different color temperatures may be composed. In a specific embodiment, the luminescent material, in addition to the yellow luminescent material (a) further comprises (b) a red luminescent material, arranged to absorb at least part of the blue LED emission or at least part of the yellow emission or both at least part of the blue emission and at least part of the yellow emission and to emit red emission. This red luminescent material may amongst others be applied to further improve the CRI.

In an embodiment, the illumination device comprises a plurality of light emitting diodes (LEDs) arranged to emit LED emission, such as in the order of 2 to 100, like 4 to 64.

The term white light as used herein, is known to the person skilled in the art. It especially relates to light having a correlated color temperature (CCT) between about 2,000 and 20,000 K, especially between 2700 and 20,000 K, for general lighting especially in the range of about 2700 K and 6500 K, and for backlighting purposes especially in the range of about 7,000 K and 20,000 K, and especially within about 15 SDCM (standard deviation of color matching) from the BBL, more particularly within about 10 SDCM from the BBL, even more particularly within about 5 SDCM from the BBL.

The terms "blue light" or "blue emission" especially relate to light having a wavelength in the range of about 410 to 490 nm. The term "green light" especially relates to light having a wavelength in the range of about 500 to 570 nm. The term "red light" especially relates to light having a wavelength in the range of about 590 to 650 nm. The term "yellow light" especially relates to light having a wavelength in the range of about 560 to 590 nm.

These terms do not exclude that especially the luminescent material may have a broad band emission with wavelength(s) outside the range of for instance about 500 to 570 nm, about 590 to 650 nm, and about 560 to 590 nm, respectively. However, the dominant wavelength of emissions of such luminescent materials (or of the LED) will be found within the ranges given herein. Hence, the phrase "with a wavelength in the range of" especially indicates that the emission may have a dominant emission wavelength within the specified range.

Especially preferred luminescent materials are selected from garnets and nitrides, especially doped with trivalent cerium or divalent europium, respectively. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1.

The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In an embodiment, the red luminescent material may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by Eu$^{2+}$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba.

The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca).

Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

The term luminescent material herein especially relates to inorganic luminescent materials, which are also sometimes indicated as phosphors. These terms are known to the person skilled in the art.

Transmissive Support

Especially at a non-zero distance from the LED(s) (i.e. especially from the light emitting surface (or dies) of the LED(s)), a transmissive support is arranged.

The term "transmissive" used herein may in an embodiment refer to transparent and in another embodiment to translucent. These terms are known to the person skilled in the art. Transmissive especially indicates that transmission of light by the transmissive support, especially at least in the blue range, more generally in the whole visible range (i.e. about 380-680 nm), is at least about 20%, more especially at least about 50%, even more especially at least about 80% (under perpendicular irradiation of the transmissive support with the light).

The transmissive support may be self-supporting, but it may in an embodiment also be a flexible film, which is for instance stretched (e.g. between LED cavity walls or diffuser cavity walls (see below) of the device). The transmissive support may have a substantially flat shape, like a plate, but may in another embodiment have a substantially convex shape, like for instance a dome.

The transmissive support may in an embodiment comprise an organic material. Preferred organic materials are selected from the group consisting of PET (polyethylene terephthalate), PE (polyethylene), PP (polypropylene), PC (polycarbonate), P(M)MA (poly(methyl)metacrylate), PEN (polyethylene naphthalate), PDMS (polydimethylsiloxane), and COC (cyclo olefin copolymer). Polycarbonate for instance gave good results.

However, in another embodiment, the transmissive support comprises an inorganic material. Preferred inorganic materials are selected from the group consisting of glasses, (fused) quartz, ceramics, and silicones.

As mentioned above, the transmissive support comprises at least part of the luminescent material. The fact that the transmissive support comprises the luminescent material does not exclude that part of the luminescent material may be arranged elsewhere in the illumination device; however, in a specific embodiment, substantially all luminescent material is comprised by the transmissive support. The phrase "the transmissive support comprises the luminescent material" may relate to a transmissive support selected from the group consisting of a transmissive support wherein the luminescent material is embedded in the transmissive support, a transmissive support that is luminescent material itself, a transmissive support having a downstream coating comprising the luminescent material (side facing the exit window), a transmissive support having an upstream coating comprising the luminescent material (side facing the LED(s), or a transmissive support comprising both an upstream and downstream coating comprising the luminescent material.

In a preferred embodiment, the transmissive support has an upstream face comprising the coating, wherein the coating comprises at least part of the luminescent material. Such an embodiment may benefit from the remote position of the luminescent material (i.e. remote from the LED) and from a relatively remote position from the exit window (desaturation of the color of the exit window when illuminated with white light).

A specific embodiment, wherein at least part of the luminescent material comprises a transmissive ceramic luminescent material, and wherein the transmissive support comprises the transmissive ceramic luminescent material. Hence, in this embodiment, the transmissive support is a luminescent ceramic. Especially suitable luminescent ceramics are based on cerium-containing garnets, as described above. Transmissive ceramic layers or luminescent ceramics, and their method of preparation, are known in the art. It is for instance referred to U.S. patent application Ser. No. 10/861,172 (US2005/0269582), to U.S. patent application Ser. No. 11/080,801 (US2006/0202105), or to WO2006/097868, to WO2007/080555, to US2007/0126017 and to WO2006/114726. The documents, and especially the information about the preparation of the ceramic layers provided in these documents, are incorporated herein by reference.

The arrangement of a transmissive ceramic layer comprising the luminescent material instead of the luminescent material being applied to the LED allows a non-zero distance between the luminescent material and the LED. This distance is herein indicated as dLL (luminescent material to LED distance). Distance dLL is particularly a shortest distance. This means that, in an embodiment, any shortest distance between the LED and the luminescent material is equal to or especially larger than 0 mm. In an embodiment, the luminescent material to LED distance (dLL) is in the range of 0.5 to 50 mm, especially in the range of 3 to 20 mm.

The transmissive support has an upstream face with an effective transmissive support upstream face diameter (DS1). Herein, the term "effective diameter" is applied. The transmissive support may have a circular shape, having a diameter, but may also have other shapes. The surface area (AS1) of any upstream face may however be applied to calculate the effective diameter ($DS1 = 2\sqrt{(AS1/\pi)}$). In a specific embodiment, the ratio dLL/DS1 is in the range of 0.01 to 1, especially in the range of 0.05 to 0.5, more especially in the range of 0.1 to 0.4. In these ranges, particularly good results may be obtained.

The illumination device may comprise more than one transmissive supports, with one or more of such transmissive supports comprising luminescent material, possibly with different luminescent material to LED distances (dLL). The more than one transmissive supports may for instance comprise different luminescent materials.

Translucent Exit Window

Especially at a non-zero distance from the downstream surface of the transmissive window, downstream of the transmissive window, a translucent exit window is arranged. This exit window is arranged to allow illumination device light to escape from the illumination device.

The translucent exit window may have a substantially flat shape, like a plate, but may in another embodiment have a substantially convex shape, like for instance a dome.

The translucent exit window may in an embodiment comprise an organic material. Preferred organic materials are selected from the group consisting of PET (polyethylene terephthalate), PE (polyethylene), PP (polypropylene), PC (polycarbonate), P(M)MA (poly(methyl)metacrylate), PEN (polyethylene naphthalate), PDMS (polydimethylsiloxane), and COC (cyclo olefin copolymer).

However, in another embodiment, the translucent exit window comprises an inorganic material. Preferred inorganic materials are selected from the group consisting of glasses, (fused) quartz, ceramics, and silicones.

The exit window however is translucent. For instance, the above mentioned materials may have intrinsic translucent properties or may be made translucent (for instance by frosting (for instance by sand blasting or acid etching, also known as "frosting") the material. Such methods are known in the art. The translucent exit window may allow some light to pass through, but the interior (i.e. upstream objects of the illumination device, upstream from the exit window) seen through translucent material is substantially diffused or indistinct.

Unlike other possible configurations, in the illumination device of the invention preferably substantially no luminescent material is arranged at the upstream or downstream face of the exit window. In an embodiment, substantially all luminescent material is comprised by the transmissive support, as described above, thereby providing a luminescent material to exit window distance (dLW) which is preferably larger than 0 mm. In an embodiment, the luminescent material may be arranged at a downstream face of the transmissive support, and the luminescent material may at least partially be in contact with the exit window, thereby providing a luminescent material to exit window distance substantially equal to zero, however, preferably the luminescent material to exit window distance (dLW) is larger than zero.

Distance dLW is especially a shortest distance. This means that in an embodiment, any shortest distance between the exit window and the luminescent material is equal to or especially larger than 0 mm. In an embodiment, the luminescent material to exit window distance (dLW) is in the range of 0.01 to 100 mm, especially in the range of 1 to 50 mm, more especially in the range of 10 to 30 mm. In general, the larger the distance, the less saturated the color of the translucent exit window may appear.

The translucent exit window has an upstream face with an exit window upstream face area (AEW1). As mentioned above, the transmissive support has an upstream face area (AS1). In a specific embodiment, the exit window and the transmissive support have a surface area ratio AEW1/AS1>1; especially $\geq 2$, more especially in the range of 2 to 20, even more especially 3 to 10. Again, in general, the larger the ratio, the less saturated the color of the translucent exit window may appear. Further, the ratio dLW/DS1 (i.e. the ratio of the luminescent layer to exit window distance and the effective transmissive support upstream face diameter) is preferably in the range of 0.01 to 1, especially in the range of 0.1 to 0.5. In general, the larger the ratio, the less saturated the color of the translucent exit window may appear.

Illumination Device

Relative to the LED(s) the transmissive support is arranged downstream of the LED(s). The transmissive support is preferably arranged in such a way that substantially all emission generated by the LED(s) is directed in the direction of the transmissive support, i.e. the transmissive support is disposed in a path of light emitted by the LED(s). Hence, in a preferred embodiment, the luminescent material and/or the transmissive support receive substantially all LED emission. Since, in an embodiment, the distance between the luminescent material and the LED is non-zero, there may be an LED chamber or LED cavity, enclosed by an LED support supporting the LED(s), the transmissive support and optionally LED cavity walls. The luminescent material and/or the transmissive support may receive substantially all LED emission after internal reflection in the LED chamber or LED cavity.

The transmissive support comprising the luminescent material is especially arranged to transmit at least part of the LED emission. In this way, the LED, with (transmissive support) transmitted LED emission and the luminescent material with luminescent material emission are arranged to generate light of a predetermined color (such as white light).

The translucent exit window is arranged downstream from the transmissive support. Hence, the transmissive support has an upstream face directed to the LED(s) and a downstream face directed to the translucent exit window; the translucent exit window has an upstream face directed to the downstream face of the transmissive support and a downstream face, directed to the exterior of the illumination device.

Since, in an embodiment, the distance between the luminescent material and the exit window is non-zero, there may be an(other) internal chamber or diffuser cavity (herein also indicated as "mixing chamber"), enclosed by the transmissive support, the exit window, and optionally diffuser cavity walls, and optionally the LED support, and optionally the LED cavity walls. In a specific embodiment, between at least part of the luminescent material and the exit window (thus especially in the diffuser cavity), a material is arranged having an index of refraction equal to or smaller than 1.2, such as in the range of 1 to 1.2, like air, carbon dioxide, helium, argon or a vacuum (vacuum is in effect absence of any material).

As mentioned above, this exit window is arranged to allow light to escape from the illumination device. However, further optics are not excluded, such as collimators, reflectors, light guides, optical layers etc. to guide or influence the illumination device light, which may be arranged downstream of the exit window.

With the invention, remote luminescent material modules and lamps can be realized that have a very high efficiency and good color rendering, and that now also can appear white or almost color-neutral when in the off-state. The proposed systems with the luminescent material in or on a transmissive support, such as a film, also enable cheap mass production by roll-to-roll processing, and combine homogenisation with efficiency optimization.

As mentioned above, the illumination device of the invention has advantageously a ratio of the diffuser cavity cross section and LED cavity cross section larger than about 1. Particularly, this may be achieved by a LED cavity reflector, especially an LED cavity reflector that is arranged to create the above mentioned ratio of the diffuser cavity cross section and LED cavity cross section. Alternative or additional methods to obtain the desired ratio are described below.

The proposed configurations can be applied in large-area lighting, ambiance lighting (e.g. light tiles), backlighting (e.g. poster boxes), downlighters, diffuse retrofit lamps such as incandescent (GLS) or TL replacement lamps, and wall washers and, depending on volume and beam constraints, in some spot lamps.

Optionally, the transmissive support may comprise a non-uniform distribution of the luminescent material. For instance, a non-uniform distribution of the phosphor may enhance the tuning capability.

BRIEF DESCRIPTION OF THE DRAWINGS

Embodiments of the invention will now be described, by way of example only, with reference to the accompanying schematic drawings in which corresponding reference symbols indicate corresponding parts, and in which.

Only the essential elements are depicted. Other elements, like drivers, further optics, like optical filters, collimators, fittings, etc., known to the person skilled in the art, are not depicted in the schematic drawings.

DESCRIPTION OF PREFERRED EMBODIMENTS

Figure 1A:
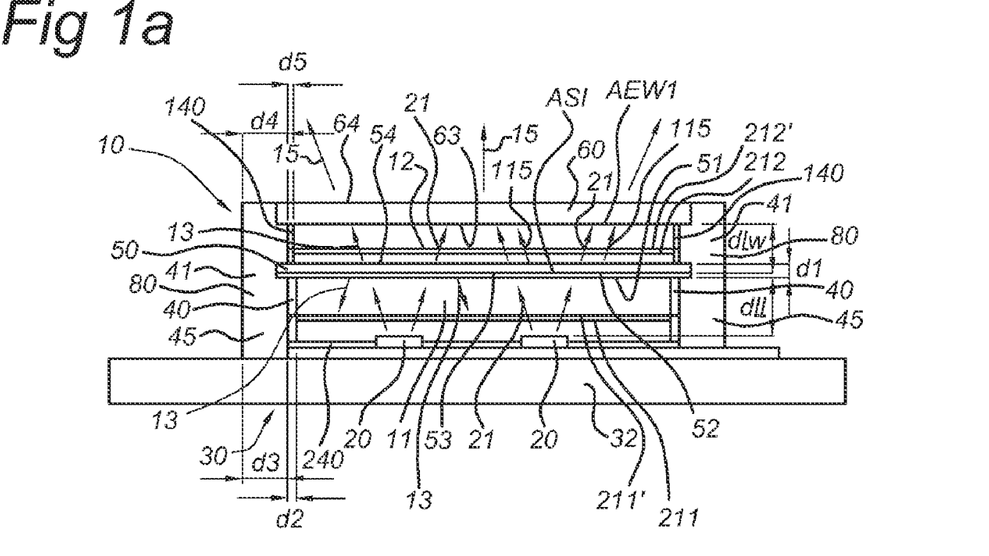
FIGS. 1a-1c schematically depict a non-limiting number of possible embodiments of the illumination device of the invention in side view.

FIG. 1a (and also FIGS. 1b-1c and 2) schematically depicts an illumination device 10 with light emitting diodes 20 arranged to emit LED emission 21. Downstream from the LEDs 20, a transmissive support 50 is arranged comprising a luminescent material 51.

The transmissive support 50 may for instance be a PET film with a luminescent material coating 52 (i.e. a coating 52 comprising the luminescent material 51), here indicated upstream of the transmissive support 50. The luminescent material 51 is arranged to absorb at least part of the LED emission 21 and emit luminescent material emission 13; the transmissive support 50 is disposed in a path of light emitted by the LED(s). The transmissive support may for instance be a film stretched between the cavity walls, which are indicated with reference 80.

The LED emission 21 may at least partially be transmitted by the transmissive support 50 (including the luminescent material 51). Hence, downstream of the transmissive support 50, LED emission 21 and luminescent material emission 13 provide light 115. Hence, the LED(s) 20 and the luminescent material 51 are arranged to generate light 115 of a predetermined color, for instance white. For instance, LED emission 21 may be blue light and luminescent material emission 13 may be yellow light, so that light 115 being provided may be white light.

The transmissive support 50 has an upstream face or side 53 and a downstream face or side 54.

The illumination device 10 further comprises a translucent exit window 60 arranged to transmit at least part of the light 115, thereby providing illumination device light 15. The translucent exit window 60 is especially arranged to diffuse the light 15 from the illumination device; the translucent exit window 60 is disposed in a path of light emitted by the luminescent material 51 and/or transmitted by the transmissive support 50. The translucent exit window may for instance be polycarbonate (PC) that is frosted. The translucent exit window 60 has an upstream face or side 63 and a downstream face or side 64.

Here, relative to the LED(s) 20, the transmissive support 50 is downstream from the LED(s) 20. The distance between the luminescent material 51 and LED(s) 20 is indicated with reference dLL. Here, dLL is larger than 0 mm. Relative to the LED(s) 20, the translucent exit window 60 is again downstream from the transmissive support 50. The distance between the luminescent material 51 and the exit window 60 is indicated with reference dLW.

In this schematic embodiment, the translucent exit window 60 has a substantially flat shape and the transmissive support 50 also has a substantially flat shape.

In the schematic embodiment, the illumination device 10 has a LED chamber or LED cavity 11, enclosed by an LED support 30 supporting the LED(s), the transmissive support 50 and LED cavity walls 45. The LED support 30 may comprise a (metal core) PCB (printer circuit board) and an aluminum housing 32. At least part of the interior of the LED cavity 11, especially the LED cavity walls 45 and the support 30, may be provided with a reflective material, such as a reflector. The reflector is indicated with reference number 240 on the support 30, and with reference number 40 on the LED cavity wall(s) 45.

In this embodiment, the diffuser cavity wall 41 of the diffuser cavity 12 is also provided with a reflector, indicated with reference 140. Hence, in an embodiment, also the diffuser cavity wall 41 comprises a reflector.

As reflector 240 on support 30, reflector 140 on diffuser cavity wall 41 and reflector 40 on LED cavity wall 45, for instance MCPET (microcellular polyethylene terephthalate) may be applied. Other reflective materials that may be used as reflector may for instance be Teflon or particulate $TiO_2$ in a matrix material. Hence, as reflectors use may be made of substantially diffuse reflectors like Teflon, MCPET (for instance from Furukawa), E60L, E6SL or E6SV (for instance from Toray), or scattering particles like $TiO_2$ in a matrix material, or substantially specular reflectors like Norbridge (commercial name Vikuiti ESR film from 3M) or MIRO (from Alanod), may be applied, or combinations of reflectors may be applied, such as a reflector that is partially diffusely reflective and partially specularly reflective.

As mentioned above, the translucent exit window 60 is arranged downstream from the transmissive support 50, and the transmissive support 50 has upstream face 53 directed to the LED(s) 20, and downstream face 54 directed to the translucent exit window 60; the translucent exit window 60 has upstream face 63 directed to the downstream face 54 of the transmissive support 50, and downstream face 64 directed to the exterior of the illumination device 10.

Since here the distance dLW between the luminescent material 51 and the exit window 60 is especially non-zero (here, the distance between transmissive support downstream face 54 and exit window upstream face 63 is also non-zero), there may be an(other) internal chamber or diffuser cavity. In the schematically depicted embodiment of FIG. 1a, this diffuser cavity is indicated with reference number 12. Here, the diffuser cavity 12 is enclosed by the transmissive support 50, the exit window 60 and the diffuser cavity walls 41. In a specific embodiment, between at least part of the luminescent material 51 and the exit window 60, here in fact between the transmissive support 50 and the exit window 60, more precisely, within diffuser cavity 12, a material may be arranged having an index of refraction equal to or smaller than 1.2, such as in the range of 1 to 1.2, like air, carbon dioxide, helium, argon or a vacuum. In general, air will be applied. Hence, the cavity downstream of the LED(s) 20 and upstream of the transmissive support 50, i.e. the cavity between the LEDs 30 and the transmissive support 50 is indicated as LED cavity 11; downstream of this LED cavity 11, i.e. downstream of the transmissive support 50 and upstream of the translucent exit window 60, the cavity between the transmissive support 50 and the translucent exit window 60 is indicated as diffuser cavity 12.

In the schematic drawing 1a, the luminescent material 51 is arranged upstream of the transmissive support 50, i.e. at the upstream face 53 of the transmissive support 50. However, as indicated above, also other configurations are possible, such as at the downstream face 54, or both at the upstream face 53 and downstream face 54 of the transmissive support 50 or contained in the transmissive support 50, or it may be the transmissive support 50 itself (luminescent ceramic, for instance). Also combinations of such embodiments may be possible.

The transmissive support 50 has a transmissive support thickness d1 (i.e. the thickness of the support including the optional coating 52 comprising the luminescent material 51), which may especially be in the range of about 0.1 to 5 mm, more especially about 0.2 to 2 mm. The LED cavity reflector 40 has a reflector thickness d2, which may especially be in the range of about 0.2 to 5 mm, more especially 0.3 to 4 mm. Especially, the thickness ratio of the reflector thickness d2 and the transmissive support thickness d1 may be in the range of about 0.5 to 10, especially in the range of about 1 to 6. In this way, best results in respect of illumination device efficiency may be obtained.

The cross section of the LED cavity, i.e. the LED cavity cross section, is indicated with reference 211; the cross section of the diffuser cavity, i.e. the diffuser cavity cross section, is indicated with reference 212. The cross sections of those cavities including (optional) reflectors 40 and 140, respectively, is indicated with reference 211' and 212', respectively.

The ratio of the diffuser cavity cross section 212 and LED cavity cross section 211 is larger than about 1. A relatively easy way to obtain such a configuration is to apply a LED cavity 11 that is narrower that the diffuser cavity 12.

This can be achieved in a number of ways. A relatively easy way is to apply a relatively thick LED cavity wall reflector 40. When applying also a diffuser cavity wall reflector 140, the thickness of the former (d2) may be larger than that of the latter (indicated with reference d5). Hence, the ratio of the diffuser cavity cross section 212 and LED cavity cross section 211 larger than about 1 may for instance be obtained by applying a thicker (d2) LED cavity reflector 40 than the diffuser cavity reflector 140.

A thicker reflector may not only be obtained by simply using a thicker reflector, but may also be obtained by using a plurality of reflective layers or reflectors as LED cavity reflector 40.

However, alternatively and/or in addition, this may also be obtained by imposing a smaller cross-section obtained by LED cavity wall(s) 45 than obtained by diffuser cavity walls 41, i.e. cross section 211 is smaller than cross section 212. For instance, LED cavity wall 45 may be thicker, indicated with reference d3, than diffuser cavity wall 41 (see also FIG. 1c), indicated with reference d4, or may be arranged relatively closer to the LEDs (i.e. the shortest lateral distance from the LED cavity wall 45 to LEDs may be smaller than the shortest lateral distance from the diffuser cavity wall to the LEDs). In fact, in this way the cross sections 211' may be made smaller than the cross section 211. Hence, also in this way the ratio of the diffuser cavity cross section 212 and LED cavity cross section 211 larger than about 1 may be obtained.

Hence, this ratio larger than about 1 may in an embodiment be achieved by the LED cavity reflector 40, especially an embodiment of the LED cavity reflector 40 that is arranged to create the above mentioned ratio of the diffuser cavity cross section 212 and LED cavity cross section 211.

The LED cavity reflector 40 is especially arranged to reflect (diffusively) the LED emission 21. However, since part of the luminescent material emission 13 may also enter the LED cavity 11, the LED cavity reflector 40 may also be arranged to reflect (diffusively) luminescent material emission 13. Further, the diffuser cavity reflector 140 is especially arranged to reflect (diffusively) the luminescent material emission 13 and the LED emission 21 (transmitted by transmissive support 50) (i.e. light 115). In an embodiment however, the LED cavity reflector may also be arranged to reflect LED emission 21 and optionally the luminescent material emission 13, specularly.

In the schematic drawing of FIG. 1a, which is a side view, the LED cavity 11 and the diffuser cavity 12 may independently have the form of a cylinder, i.e. when the device 10 is viewed from above, substantially a circular symmetry would be seen for the cavities. As mentioned above, the device 10 of the invention is not limited to such a shape.

Figure 1B:
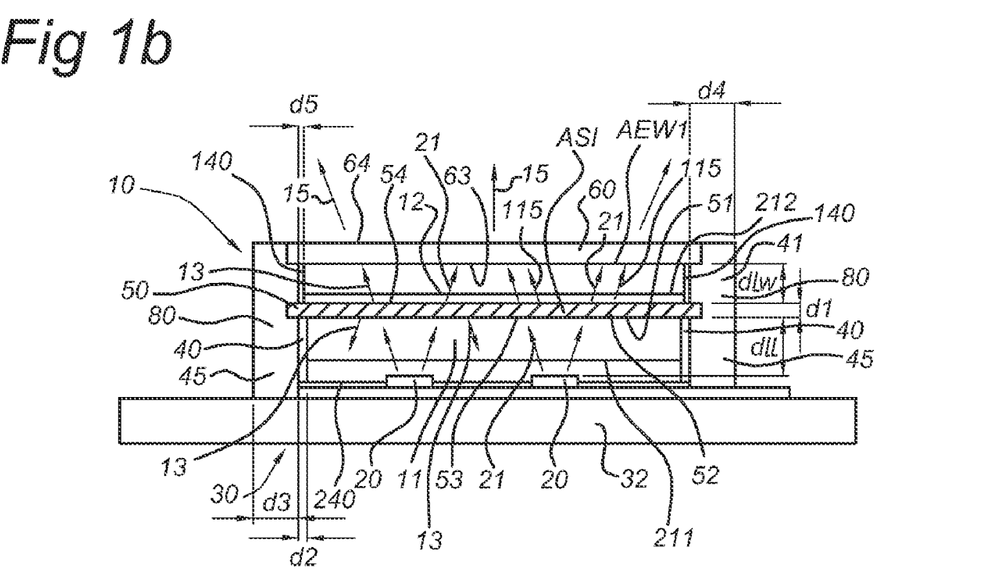

FIG. 1b is a schematical Figure of another embodiment of the illumination device 10. This embodiment is not substantially different from the embodiment schematically depicted in FIG. 1a (described above); however in this embodiment, instead of a transparent support 50 comprising the coating 52 comprising the luminescent material 51 arranged at the upstream face 53 of the transmissive support, here the transmissive support 50 comprises a luminescent ceramic material. In this way, the transmissive support 50 contains the luminescent material 51.

In the schematic embodiments of FIGS. 1a and 1b, the upstream surface area of the transmissive support 50, indicated with reference AS1, and the upstream surface area of the translucent exit window 60, indicated with reference AEW1, are substantially the same (i.e. AEW1/AS1≈1).

Figure 1C:
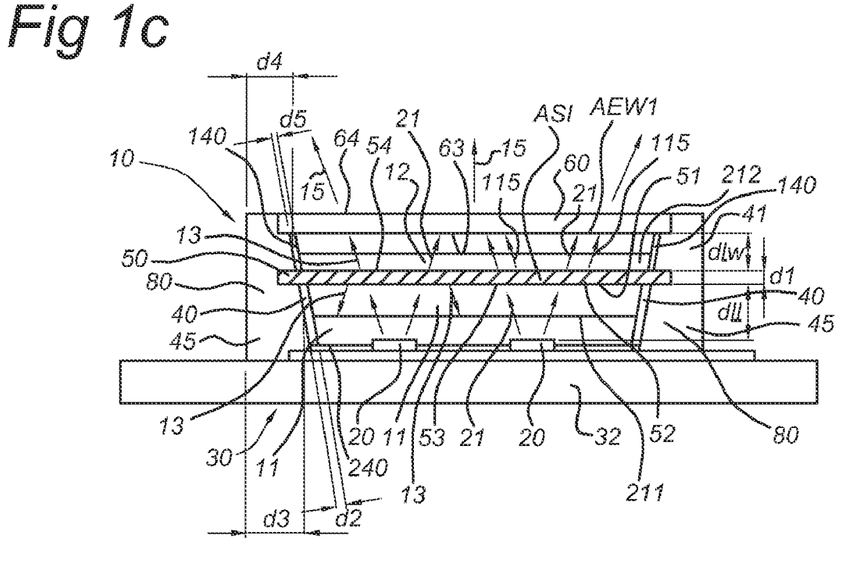

FIG. 1c schematically depicts the same embodiment as schematically depicted in FIGS. 1a and 1b, especially 1b, with the difference that AEW1/AS1≈1. Also the ratio of the diffuser cavity cross section 212 and LED cavity cross section 211 may be substantially larger than 1, such as in the range of 1.1 to 2.

In the case of the LED cavity wall 45 and/or the diffuser cavity wall 41 having slopes, respectively, the cavity cross sections 211 and 212 (and cross sections 211' and 212') refer to mean cavity cross sections. Likewise, here, wall thicknesses d3 and d4, respectively, are mean wall thicknesses. Here, in FIG. 1c, the diffuser cavity wall 41 has a mean wall thickness d4 which is smaller than the mean wall thickness d3 of the LED cavity wall 45.

FIG. 1c schematically depicts an embodiment wherein relatively easily a ratio of the diffuser cavity cross section 212 and LED cavity cross section 211 larger than 1 can be obtained. Hence, the LED cavity 11 and/or the diffuser cavity 12 may have tapered or sloping walls 45 and 41, respectively, wherein the walls are tapered to provide a cavity cross section that is smaller upstream than downstream. For instance, the cavity cross section of the LED cavity 11 at the LEDs, i.e. at support 30, is smaller than at the transmissive support 50.

FIG. 1c depicts a side view of an embodiment of the device 10. Assuming that the cavities have a substantially circular symmetry (when viewed) from above (i.e. the cavity cross sections 211,212 are circular), the cavities in FIG. 1c have the form of apex-truncated cones, with the truncated apex at the bottom (i.e. at support 300) or upstream. However, the cavities in FIG. 1c may also have the form of apex-truncated square pyramids, with the truncated apex at the bottom (i.e. at support 300) or upstream. When viewed from above, a square symmetry will be found; i.e. the cross-sections 211,212 are square.

As mentioned above, other shapes are possible. Also walls 45 and 41, or at least the part directed to the cavities, may be curved. In this way, apex-truncated paraboloids of revolution may be obtained. Combinations of cavity symmetries may also be applied. Therefore, the cross-sections 211 and 212 may independently be circular, square, rectangular, pentagonal, or hexagonal, especially circular, square or hexagonal, more especially circular or hexagonal.

Figure 2:
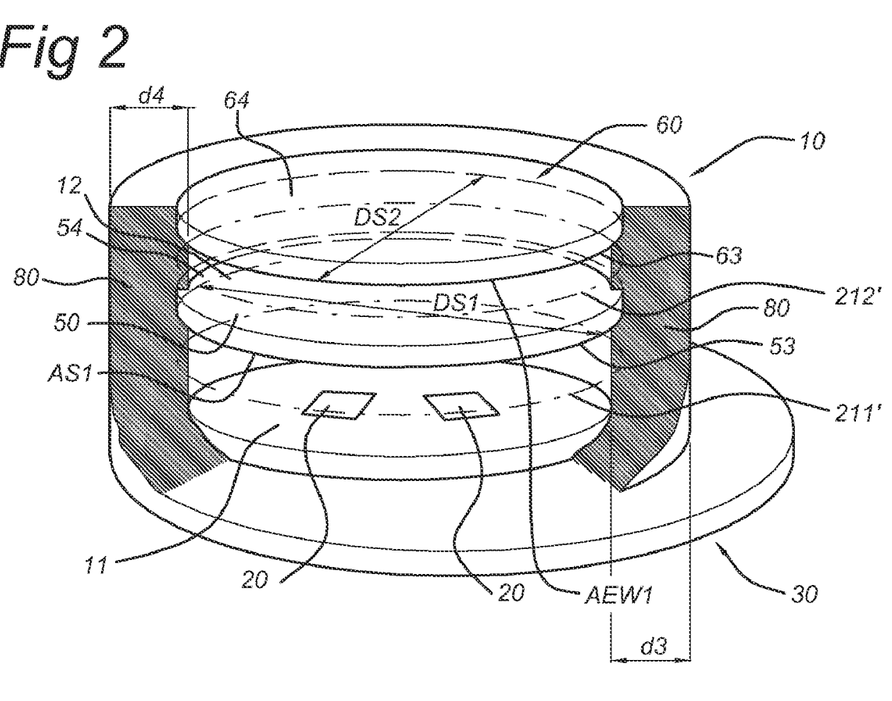
FIG. 2 depicts an embodiment of the invention in a perspective view.

FIG. 2 schematically depicts the embodiments of 1a or 1b in a perspective side view, in order to further illustrate these embodiments. Here the transmissive support 50 and the translucent exit window 60 are both circular (exit) windows, with upstream/downstream faces 53/54 and 63/64, respectively. The upstream face 53 of transmissive support 50 has an effective diameter DS1; the upstream face 63 of the translucent exit window 60 has an effective diameter DS2. The upstream face 53 of the transmissive support 50 has an area AS1 and the upstream face 63 of the translucent exit window 60 has an area AEW1.

Note that in FIGS. 1a-1c and 2, the diffuser cavity walls 41 and LED cavity walls 45 may be integral pieces (i.e. single wall(s) 80).

The above described and schematically depicted embodiments are non-limiting. The transmissive support 50 and the exit window 60 are schematically depicted as flat supports or windows. However, other configurations are also possible. For instance, a substantially flat exit window 60 and a non-flat, for instance substantially convex, transmissive support 50 may also be an embodiment. Or, a substantially flat transmissive support 50 and a non-flat, for instance convex exit window 60, may be applied.

In an example, DS1 was fixed at 60 mm, AEW1/AS1 was fixed at 1, the LED 20 to exit window 60 distance (i.e. substantially dLL+dLW) was fixed at 30 mm and the value of dLL was varied between 5 and 30 mm. The following results were obtained:

| dLL (mm) | CCT (K) |
|---|---|
| 7.5 | 2635 |
| 15 | 2664 |
| 22.5 | 2698 |
| 30 | 2719 |

It appears that the color temperature can be adjusted depending upon the luminescent material to LED distance dLL. Here, blue emitting LEDs 20 and cerium-doped garnets as luminescent material 51 were applied in order to obtain white light 13.

Keeping the upstream surface area AEW1 of the translucent exit window 60 equal to the luminescent material surface area (for the sake of simplicity, herein the transmissive window upstream face area AS1 is taken) and increasing the distance dLW between both, ensuring a high diffuse reflectivity of the material that forms the wall 41 between the luminescent material 51 and the translucent exit window 60 (i.e. the walls 41 of diffuser cavity 12), results in a reduction of the saturation while the system efficacy is hardly reduced.

The reduction in saturation of the color of the exit window 60 (in the off-state) appeared in an embodiment to be as follows: by increasing the distance dLW between the luminescent material 51 and the translucent exit window 60 from 0 to 80% of the diameter of the luminescent material area (here, again AS1 is taken), the saturation is reduced from about 50% to about 20%. Typically, in downlighting applications one would like to limit the aspect ratio to ca. 50% due to volume constraints. Therefore it is advantageous to mount the luminescent material 51 relative close to the LED(s) 20.

Another concern in the application of LEDs 20 and remote luminescent material 51 is the homogeneity of the illumination device light 15. To achieve sufficient homogeneity at the exit window 60, the translucent exit window 60 should preferably be placed at a sufficiently large distance from the LED(s) 20: typically at least 1.5 times the pitch between the LEDs, such as in the order of about 1.5-5 times the distance (pitch) between the LEDs. Mounting the transmissive support comprising the luminescent material near the LEDs 20 that may emit light inhomogeneously, and mounting a translucent exit window 60 at some distance from the luminescent material 51, results in excellent homogeneity of the light 15 emitted from the translucent exit window 60, and at the same time optimises the remote luminescent material 51 efficiency.

Example

A device 10 was made with transmissive support 50 comprising luminescent material 51 consisting of a foil coated with the luminescent material. The total diameter of the transmissive support 50 was 60 mm. The luminescent material consists of YAG:Ce$^{3+}$. The coating comprises the YAG:Ce$^{3+}$ (and binder material). The LED-support distance dLL was; the distance luminescent material—transmissive support, dLW was 15 mm; hence the total cavity height of both cavities was about 30 mm. The transmissive support foil (including luminescent material 51) has a thickness of about 250 µm and; the transmissive support 50 is arranged between the walls of the cavities. The LED cavity reflector thickness d2 is 2*0.8 mm (of MCPET); the diffuser cavity reflector 140 has a thickness d5 of 0.8 mm (and is also of MCPET). The cavity cross section ratio was 1.053. The exit window 60 (diffuser) comprises frosted polycarbonate (frosted PC) with a thickness of about 2 mm. 18, homogeneously distributed, LEDs 20 emitting blue light were applied. The efficiency appeared to be higher for this device than for a similar device wherein the cross sections 211 and 212, respectively, were substantially identical.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The devices herein are amongst others described during operation. For instance, the term "blue LED" refers to an LED which during operation thereof generates blue light; in other words: the LED is arranged to emit blue light. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An illumination device comprising:
a light emitting diode (LED) arranged to emit LED emission;
a transmissive support comprising a luminescent material arranged to absorb at least part of the LED emission, and emit luminescent material emission wherein the LED and the luminescent material are configured to generate light of a predetermined color;
a translucent exit window arranged to transmit at least part of the light;
a LED cavity and a diffuser cavity, wherein the LED cavity has a LED cavity side wall and a LED cavity cross section, and the diffuser cavity has a diffuser cavity side wall and a diffuser cavity cross section, wherein, relative to the LED,
the transmissive support is downstream of the LED and upstream of the translucent exit window;
the LED cavity is upstream of the transmissive support and downstream of the LED;
the diffuser cavity is downstream of the transmissive support and upstream of the translucent exit window;
the ratio of the diffuser cavity cross section and LED cavity cross section is larger than 1;
wherein the LED cavity side wall comprises a LED cavity reflector arranged to reflect at least one LED emission and luminescent material emission back into the LED cavity;
wherein the transmissive support has a thickness (d1) in the range of 0.1 to 5 mm;
wherein the LED cavity reflector has a reflector thickness (d2) in the range of 0.2 to 5 mm;
wherein the thickness ratio of the thickness (d2) and the thickness (d1) is in the range of 0.5 to 10.

2. The illumination device according to claim 1, wherein the ratio of the diffuser cavity cross section and LED cavity cross section is in the range of 1.01 to 1.2.

3. The illumination device according to claim 1, wherein the LED cavity reflector has a reflectivity under perpendicular irradiation of visible light of at least 95%.

4. The illumination device according to claim 3, wherein the LED cavity reflector comprises a diffuse reflector.

5. The illumination device according to claim 3, wherein the LED cavity reflector comprises a specular reflector.

6. The illumination device according to claim 1, wherein the transmissive support comprises an organic material selected from the group consisting of PET (polyethylene terephthalate), PE (polyethylene), PP (polypropylene), PC (polycarbonate), P(M)MA (poly(methyl)metacrylate), PEN (polyethylene napthalate), PDMS (polydimethylsiloxane) and COC (cyclo olefin copolymer).

7. The illumination device according to claim 1, wherein the transmissive support comprising a luminescent material comprises a transmissive ceramic luminescent material.

8. The illumination device according to claim 1, wherein the LED cavity and the diffuser cavity have the form of a cylinder.

9. The illumination device according to claim 1, wherein the LED cavity and the diffuser cavity have a hexagonal shape.

10. The illumination device of claim 4, wherein the diffuse reflector comprises at least one material selected from the group consisting of polytetrafluoroethylene, MCPET, and TiO.sub.2 particles dispersed in a matrix material.

11. The illumination device according to claim 1, wherein the transmissive support has a thickness (d1) in the range of 0.2 mm to 2 mm; the LED cavity reflector has a thickness (d2) in the range of 0.3 mm to 4 mm, and the ratio of d2/d1 is in the range of 1 to 6.

* * * * *